United States Patent
Chen et al.

(10) Patent No.: US 9,093,511 B2
(45) Date of Patent: Jul. 28, 2015

(54) TRANSISTOR HAVING HIGH BREAKDOWN VOLTAGE AND METHOD OF MAKING THE SAME

(71) Applicant: TAIWAN SEMICONDUCTOR MANUFACTURING COMPANY, LTD., Hsinchu (TW)

(72) Inventors: Chi-Ming Chen, Zhubei (TW); Po-Chun Liu, Hsinchu (TW); Chung-Yi Yu, Hsinchu (TW); Chia-Shiung Tsai, Hsinchuq (TW); Xiaomeng Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/944,713

(22) Filed: Jul. 17, 2013

(65) Prior Publication Data
US 2015/0021661 A1    Jan. 22, 2015

(51) Int. Cl.
*H01L 29/778* (2006.01)
*H01L 29/66* (2006.01)
*H01L 21/02* (2006.01)
*H01L 29/417* (2006.01)
*H01L 29/20* (2006.01)

(52) U.S. Cl.
CPC ........ *H01L 29/7786* (2013.01); *H01L 21/0251* (2013.01); *H01L 21/0254* (2013.01); *H01L 21/0262* (2013.01); *H01L 21/02458* (2013.01); *H01L 21/02507* (2013.01); *H01L 21/02579* (2013.01); *H01L 29/66462* (2013.01); *H01L 29/2003* (2013.01); *H01L 29/41766* (2013.01)

(58) Field of Classification Search
CPC ............ H01L 29/778; H01L 29/66431; H01L 29/812
USPC .......................................... 257/194, 190.191
See application file for complete search history.

(56) References Cited

U.S. PATENT DOCUMENTS

| | | | | |
|---|---|---|---|---|
| 5,976,920 | A * | 11/1999 | Nakano et al. | 438/172 |
| 7,112,830 | B2 | 9/2006 | Munns | |
| 7,547,925 | B2 | 6/2009 | Wong et al. | |
| 2007/0108456 | A1 | 5/2007 | Wong et al. | |
| 2009/0045438 | A1* | 2/2009 | Inoue et al. | 257/192 |
| 2012/0223365 | A1* | 9/2012 | Briere | 257/194 |
| 2013/0146904 | A1* | 6/2013 | Edmond et al. | 257/88 |
| 2014/0091314 | A1* | 4/2014 | Ishiguro et al. | 257/76 |
| 2014/0091318 | A1* | 4/2014 | Ishiguro et al. | 257/76 |

OTHER PUBLICATIONS

Srivastava, P., et al., "Si Trench Around Drain (STAD) Technology of GaN-DHFETs on Si Substrate for Boosting Power Performance", IEEE, 2001.

* cited by examiner

*Primary Examiner* — Peter Bradford
(74) *Attorney, Agent, or Firm* — Lowe Hauptman & Ham, LLP

(57) ABSTRACT

A transistor includes a substrate and a graded layer on the substrate, wherein the graded layer is doped with p-type dopants. The transistor further includes a superlattice layer (SLS) on the graded layer, wherein the SLS has a p-type dopant concentration equal to or greater than $1\times10^{19}$ ions/cm$^3$. The transistor further includes a buffer layer on the SLS, wherein the buffer layer comprises p-type dopants. The transistor further includes a channel layer on the buffer layer and an active layer on the second portion of the channel layer, wherein the active layer has a band gap discontinuity with the second portion of the channel layer.

20 Claims, 10 Drawing Sheets

US 9,093,511 B2

TRANSISTOR HAVING HIGH BREAKDOWN VOLTAGE AND METHOD OF MAKING THE SAME

RELATED APPLICATIONS

The instant application is related to the following U.S. Patent Applications:

U.S. patent application Ser. No. 13/944,779 titled "TRANSISTOR HAVING PARTIALLY OR WHOLLY REPLACED SUBSTRATE AND METHOD OF MAKING THE SAME;"

U.S. patent application Ser. No. 13/944,584 titled "TRANSISTOR HAVING BACK-BARRIER LAYER AND METHOD OF MAKING THE SAME;"

U.S. patent application Ser. No. 13/944,494 titled "TRANSISTOR HAVING DOPED SUBSTRATE AND METHOD OF MAKING THE SAME;"

U.S. patent application Ser. No. 13/944,672 titled "TRANSISTOR HAVING A BACK-BARRIER LAYER AND METHOD OF MAKING THE SAME;"

U.S. patent application Ser. No. 14/010,268 titled "TRANSISTOR HAVING OHMIC CONTACT BY GRADIENT LAYER AND METHOD OF MAKING SAME;"

U.S. patent application Ser. No. 14/010,220 titled "TRANSISTOR HAVING AN OHMIC CONTACT BY SCREEN LAYER AND METHOD OF MAKING THE SAME;"

U.S. patent application Ser. No. 13/948,925 titled "TRANSISTOR HAVING METAL DIFFUSION BARRIER AND METHOD OF MAKING THE SAME;" and U.S. patent application Ser. No. 13/944,625 titled "SEMICONDUCTOR DEVICE, HIGH ELECTRON MOBILITY TRANSISTOR (E-HEMT) AND METHOD OF MANUFACTURING."

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
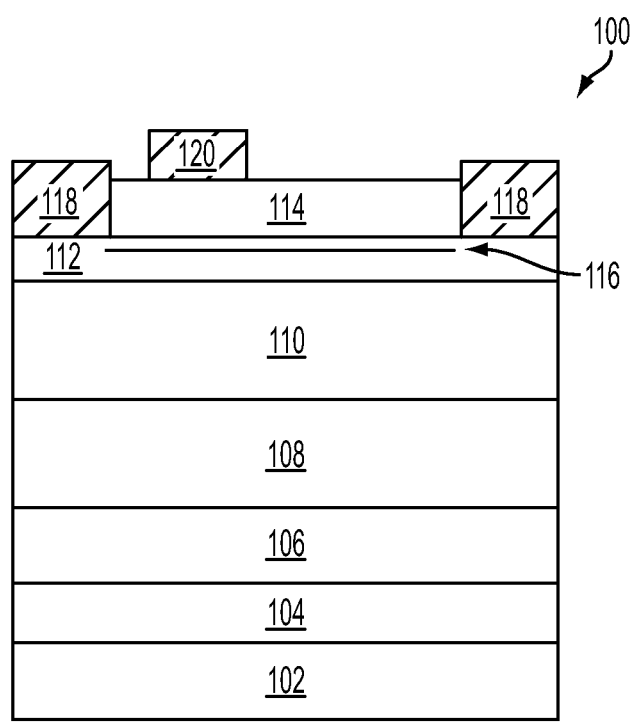
FIG. 1 is a cross-sectional view of a high electron mobility transistor (HEMT) in accordance with one or more embodiments.

FIG. 1 is a cross-sectional view of a high electron mobility transistor (HEMT) 100 in accordance with one or more embodiments. HEMT 100 includes a substrate 102. A nucleation layer 104 is over substrate 102. In some embodiments, nucleation layer 104 includes multiple layers, such as seed layers. A graded layer 106 is over the nucleation layer 104. A superlattice layer (SLS) 108 is over graded layer 106. A buffer layer 110 is over SLS 108. Buffer layer 110 is doped with p-type dopants. A channel layer 112 is over buffer layer 110. An active layer 114 is over channel layer 112. Due to a band gap discontinuity between channel layer 112 and active layer 114, a two dimension electron gas (2-DEG) 116 is formed in the channel layer near an interface with the active layer. Electrodes 118 are over channel layer 112 and a gate 120 is over active layer 114 between the electrodes.

Substrate 102 acts as a support for HEMT 100. In some embodiments, substrate 102 is a silicon substrate. In some embodiments, substrate 102 includes silicon carbide (SiC), sapphire, or another suitable substrate material. In some embodiments, substrate 102 is a silicon substrate having a (111) lattice structure.

Nucleation layer 104 helps to compensate for a mismatch in lattice structures between substrate 102 and graded layer 106. In some embodiments, nucleation layer 104 includes multiple layers. In some embodiments, nucleation layer 104 includes a same material formed at different temperatures. In some embodiments, nucleation layer 104 includes a stepwise change in lattice structure. In some embodiments, nucleation layer 104 includes a continuous change in lattice structure. In some embodiments, nucleation layer 104 is formed by epitaxially growing the nucleation layer on substrate 102.

In at least one example, nucleation layer 104 comprises a first layer of aluminum nitride (AlN) and a second layer of AlN over the first layer of AlN. The first layer of AlN is formed at a low temperature, ranging from about 900° C. to about 1000° C., and has a thickness ranging from about 20 nanometers (nm) to about 80 nm. If the thickness of the first layer of AlN is too small, subsequent layers formed on the first layer of AlN will experience a high stress at the interface with the first AlN layer due to lattice mismatch increasing a risk of layer separation. If the thickness of the first layer of AlN is too great, the material is wasted and production costs increase. The second layer of AlN is formed at a high temperature, ranging from about 1000° C. to about 1300° C., and has a thickness ranging from about 50 nm to about 200 nm. The higher temperature provides a different lattice structure in the second AlN layer in comparison with the first AlN layer. The lattice structure in the second AlN layer is more different from a lattice structure of substrate 102 than the first AlN layer. If the thickness of the second layer of AlN is too small, subsequent layers formed on the second layer of AlN will experience a high stress at the interface with the second layer of AlN due to lattice mismatch increasing the risk of layer separation. If the thickness of the second layer of AlN is too great, the material is wasted and production costs increase.

In some embodiments, nucleation layer 104 is omitted, and thus buffer layer 106 is directly on substrate 102.

Graded layer 106 provides additional lattice matching between nucleation layer 104 and SLS 108. In some embodiments, graded layer 106 is doped with p-type dopants to reduce the risk of electron injection from substrate 102. Electron injection occurs when electrons from substrate 102 diffuse into channel layer 112. By including p-type dopants, the electrons are trapped by the positively charged dopants and do not negatively impact performance of 2-DEG 116 in channel layer 112. In some embodiments, the p-type dopant concentration in graded layer 106 is greater than or equal to $1 \times 10^{17}$ ions/cm$^3$. In some embodiments, the p-type dopants include carbon, iron, magnesium, zinc or other suitable p-type dopants. In some embodiments, graded layer 106 includes aluminum gallium nitride ($Al_xGa_{1-x}N$), where x is the aluminum content ratio in the graded layer. In some embodiments, the graded layer includes multiple layers each having a decreased ratio x (from a layer adjoining nucleation layer 104 to a layer that adjoins SLS 108, or from the bottom to the top portions of the graded layer). In at least one embodiment, graded layer 106 has three layers whose ratios x are 0.75, 0.5 and 0.25, respectively. In at least another embodiment, the graded aluminum gallium nitride layer has four layers whose ratios x are 0.75, 0.5, 0.25, and 0.1, respectively, from the bottom to the top. In some embodiments, instead of having multiple layers, the graded layer has a continuous gradient of the x value. In some embodiments, x ranges from about 0.9 to about 0.1. In some embodiments, graded layer has a thickness ranging from about 1350 nm to about 2550 nm. If graded layer 106 is too thin, electrons from substrate 102 will be injected into channel layer 112 at high voltages, negatively impacting 2-DEG 116. If graded layer 106 is too thick, material is wasted and production costs increase. In some embodiments, the graded layer is formed at a temperature ranging from about 1000° C. to about 1200° C. In some embodiments, a p-type dopant concentration of graded layer 106 increases from a bottom of the graded layer to a top of the graded layer.

In at least one example, graded layer 106 includes four graded layers. A first graded layer adjoins nucleation layer 104. The first graded layer includes $Al_xGa_{1-x}N$, where x ranges from about 0.7 to about 0.9. A thickness of the first graded layer ranges from about 50 nm to about 200 nm. A p-type dopant concentration of the first graded layer is greater than or equal to $1 \times 10^{17}$ ions/cm$^3$. A second graded layer is on the first graded layer. The second graded layer includes $Al_xGa_{1-x}N$, where x ranges from about 0.4 to about 0.6. A thickness of the second graded layer ranges from about 150 nm to about 250 nm. A p-type dopant concentration of the second graded layer is greater than or equal to $3 \times 10^{17}$ ions/cm$^3$. A third graded layer is on the second graded layer. The third graded layer includes $Al_xGa_{1-x}N$, where x ranges from about 0.15 to about 0.3. A thickness of the third graded layer ranges from about 350 nm to about 600 nm. A p-type dopant concentration of the third graded layer is greater than or equal to $5 \times 10^{17}$ ions/cm$^3$. A fourth graded layer is on the third graded layer. The fourth graded layer includes $Al_xGa_{1-x}N$, where x ranges from about 0.05 to about 0.1. A thickness of the second graded layer ranges from about 800 nm to about 1500 nm. A p-type dopant concentration of the fourth graded layer is greater than or equal to $1 \times 10^{18}$ ions/cm$^3$.

SLS 108 is used to provide additional lattice matching and to prevent electrons from substrate 102 diffusing into channel layer 112. SLS 108 includes a plurality of layer pairs. SLS 108 is doped with p-type dopants. In some embodiments, a dopant concentration of SLS 108 is equal to or greater than $1 \times 10^{19}$ ions/cm$^3$. In some embodiments, the p-type dopants include carbon, iron, magnesium, zinc or other suitable p-type dopants. In some embodiments, each layer pair includes a layer of AlN and a layer of GaN. In some embodiments, a thickness of the AlN layer ranges from about 2 nm to about 6 nm. In some embodiments, a thickness of the GaN layer ranges from about 10 nm to about 30 nm. In some embodiments, each layer pair includes a layer of $Al_xGa_{1-x}N$ and a layer of $Al_yGa_{1-y}N$, where x ranges from about 0.8 to about 1.0 and y ranges from about 0.0 to about 0.2. In some embodiments, a thickness of the $Al_xGa_{1-x}N$ layer ranges from about 2 nm to about 6 nm. In some embodiments, a thickness of the $Al_yGa_{1-y}N$ layer ranges from about 10 nm to about 30 nm. In some embodiments, a number of layer pairs ranges from about 20 to about 100. If the number of layer pairs is too small, SLS 108 will be unable to provide sufficient lattice matching and a risk of layer separation between buffer layer 110 and SLS 108 increases. If the number of layer pairs is too great, the p-type dopants in SLS 108 increase a tensile stress within the SLS and increases a risk of damage to HEMT 100. In some embodiments, SLS 108 is formed at a temperature ranging from about 950° C. to about 1150° C.

Buffer layer 110 provides a p-type doped layer to reduce electron injection from substrate 102. In some embodiments, buffer layer 110 includes GaN doped with p-type dopants. In some embodiments, the p-type dopants include carbon, iron, magnesium, zinc or other suitable p-type dopants. In some embodiments, a concentration of the p-type dopant is greater than or equal to about $1 \times 10^{19}$ ions/cm$^3$. If the p-type dopant concentration is too low, buffer layer 110 will not be able to effectively prevent electron injection from substrate 102. If the p-type dopant concentration is too high, p-type dopants will diffuse into channel layer 112 and negatively impact 2-DEG 116. In some embodiments, buffer layer 110 is formed using an epitaxial process. In some embodiments, buffer layer 110 is formed at a temperature ranging from about 1000° C. to about 1200° C. In some embodiments, buffer layer 110 has a thickness ranging from about 0.5 microns (μm) to about 5.0 μm. If buffer layer 110 is too thin, the buffer layer will not be able to effectively prevent electron injection from substrate 102. If buffer layer 110 is too thick, the amount of p-type dopants will negatively impact the performance of channel layer 112 by attracting electrons away from 2-DEG 116.

Channel layer 112 is used to help form a conductive path for selectively connecting electrodes 118. In some embodiments, channel layer 112 includes undoped GaN. In some embodiments, channel layer 112 has a thickness ranging from about 0.2 μm to about 1.0 μm. If a thickness of channel layer 112 is too thin, the channel layer will not provide sufficient charge carriers to allow HEMT 100 to function properly. If the thickness of channel layer 112 is too great, material is wasted and production costs increase. In some embodiments, channel layer 112 is formed by an epitaxial process. In some embodiments, channel layer 112 is formed at a temperature ranging from about 1000° C. to about 1200° C.

Active layer 114 is used to provide the band gap discontinuity with channel layer 112 to form 2-DEG 116. In some embodiments, active layer 114 includes AlN. In some embodiments, active layer 114 includes a mixed structure, e.g., $Al_xGa_{1-x}N$, where x ranges from about 0.1 to 0.3. In some embodiments, active layer 114 includes both AlN and the mixed structure. In some embodiments, active layer 114 has a thickness ranging from about 10 nm to about 40 nm. In some embodiments where active layer 114 includes an AlN layer and a mixed structure layer, a thickness of the AlN layer ranges from about 0.5 nm to about 1.5 nm and a thickness of the mixed structure layer ranges from about 10 nm to about 40 nm. If active layer 114 is too thick, selectively controlling the conductivity of the channel layer is difficult. If active layer 114 is too thin, an insufficient amount of electrons are available for 2-DEG 116. In some embodiments, active layer 114 is formed using an epitaxial process. In some embodiments, active layer 114 is formed at a temperature ranging from about 1000° C. to about 1200° C.

2-DEG 116 acts as the channel for providing conductivity between electrodes 118. Electrons from a piezoelectric effect in active layer 114 drop into channel layer 112, and thus create a thin layer of highly mobile conducting electrons in the channel layer.

Electrodes 118 act as a source and a drain for HEMT 100 for transferring a signal into or out of the HEMT. Gate 120 helps to modulate conductivity of 2-DEG 116 for transferring the signal between electrodes 118.

HEMT 100 is normally conductive meaning that a positive voltage applied to gate 120 will reduce the conductivity between electrodes 118 along 2-DEG 116.

Figure 2:
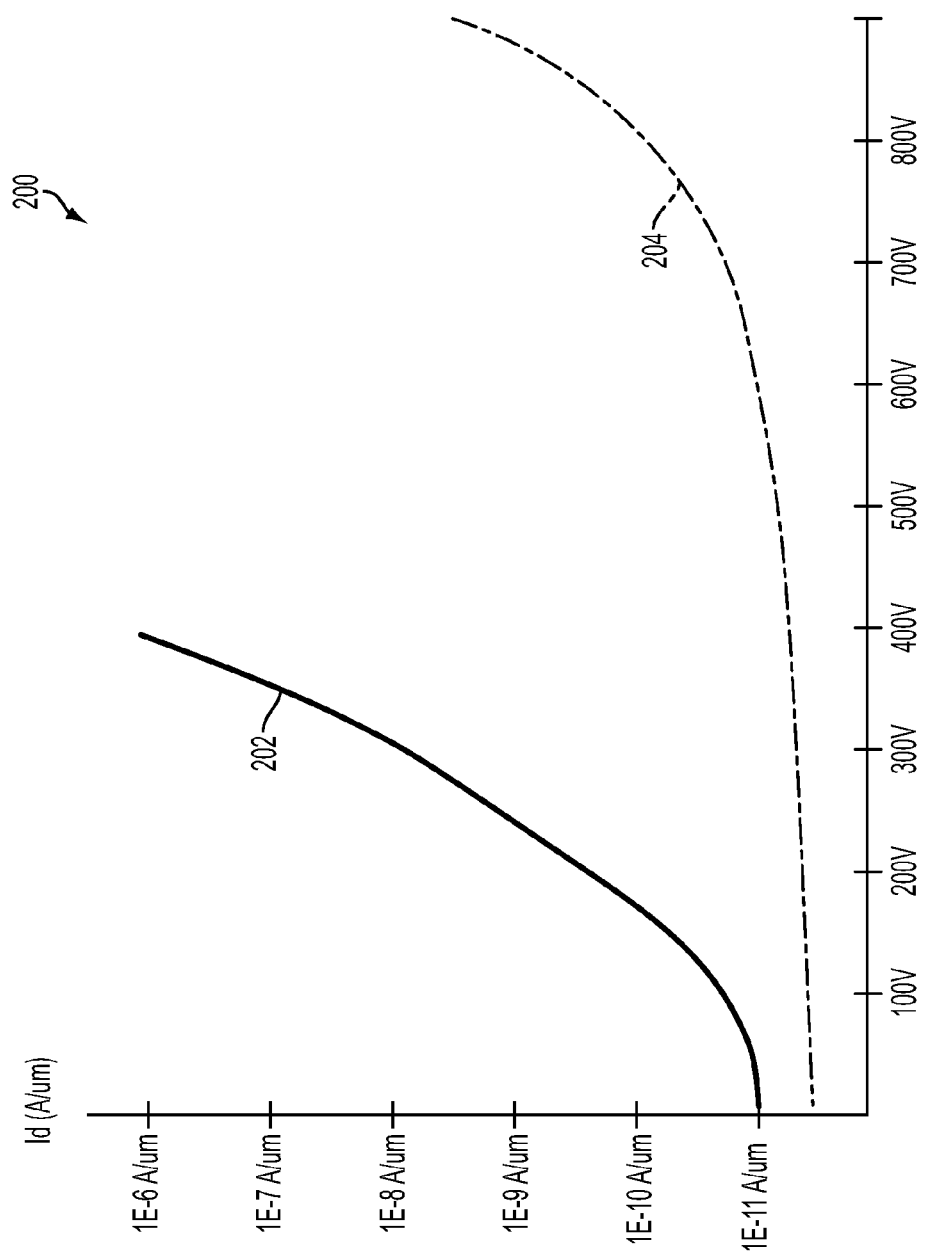
FIG. 2 is a graph of a gate voltage versus a drain current of the HEMT of FIG. 1 and of an another HEMT in accordance with one or more embodiments.

FIG. 2 is a graph 200 of a gate voltage versus a drain current of HEMT 100 and of another HEMT in accordance with one or more embodiments. A voltage at which the drain current sharply increases indicates a breakdown voltage of the HEMT. Graph 200 indicates a drain current 202 for the other HEMT as a function of a voltage applied to a gate of the other HEMT. Graph 200 indicates a drain current 204 of HEMT 100 as a function of a voltage applied to gate 120. Graph 200 indicates a breakdown voltage for the other HEMT is at about 100 volts (V). As a result, if a voltage of 100 V is applied to the gate of the other HEMT, the other HEMT will be damaged and provide uncontrolled conductivity between electrodes 118. Graph 200 indicates a breakdown voltage for HEMT 100 of about 800 V. The increased breakdown voltage is a result of the high carbon concentration in graded layer 106, SLS 108 and buffer layer 110. The high carbon concentration provides better electron injection prevention in comparison with the other HEMT. HEMT 100 is suitable for higher voltage application in comparison with the other HEMT due to the higher breakdown voltage.

Figure 3:
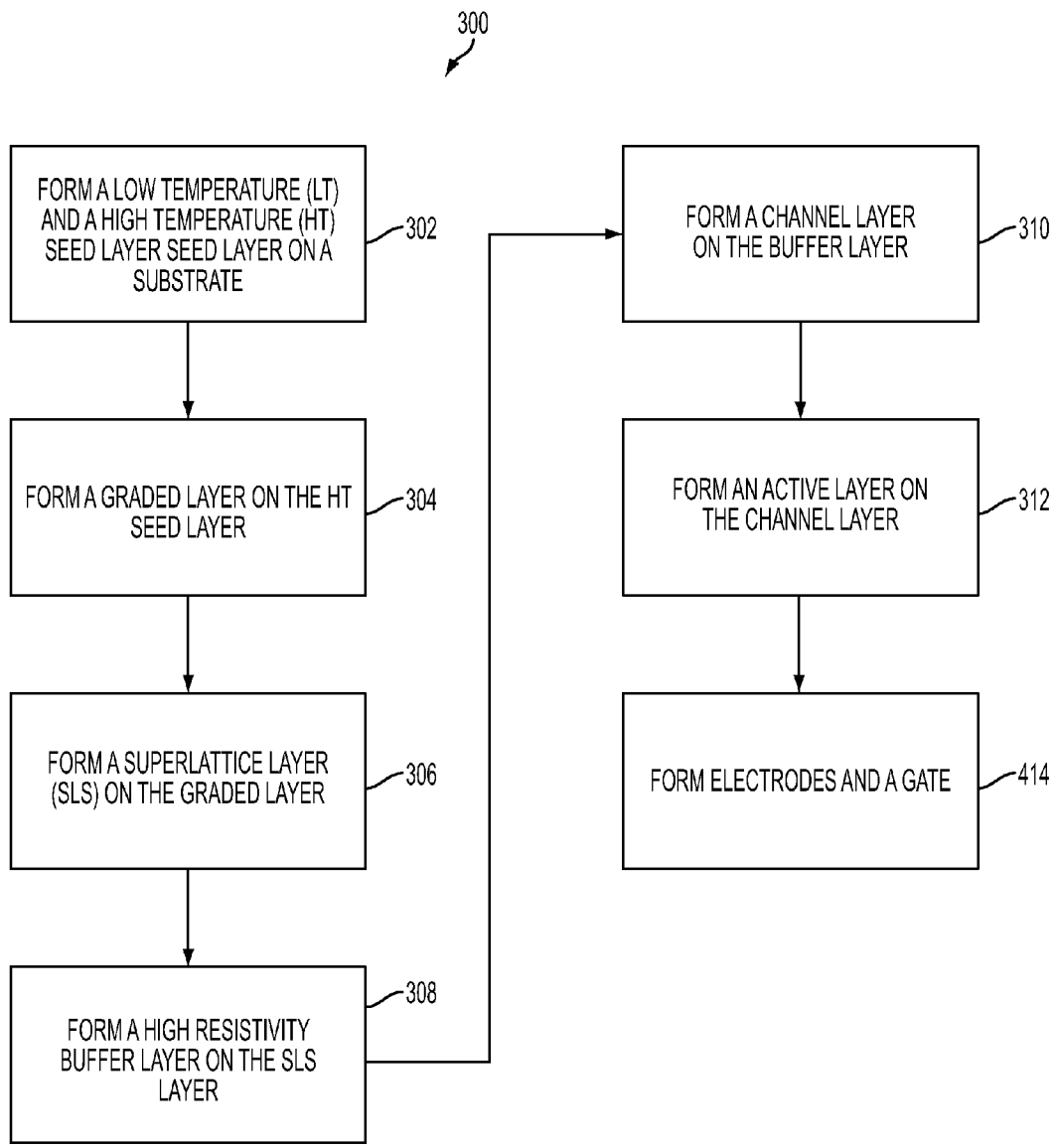
FIG. 3 is a flow chart of a method of making an HEMT in accordance with one or more embodiments.

FIG. 3 is a flow chart of a method 300 of making an HEMT in accordance with one or more embodiments. Method 300 begins with operation 302 in which a low temperature (LT) seed layer and a high temperature (HT) seed layer are formed on a substrate, e.g., substrate 102. The LT seed layer is formed on the substrate and the HT seed layer is formed on the LT seed layer.

In some embodiments, LT seed layer and HT seed layer include AN. In some embodiments, the formation of LT seed layer and HT seed layer are performed by an epitaxial growth process. In some embodiments, the epitaxial growth process includes a metal-organic chemical vapor deposition (MOCVD) process, a molecular beam epitaxy (MBE) process, a hydride vapor phase epitaxy (HVPE) process or another suitable epitaxial process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the LT seed layer or the HT seed layer includes a material other than AN. In some embodiments, the HT seed layer has a thickness ranging from about 50 nm to about 200 nm. In some embodiments, the HT seed layer is formed at a temperature ranging from about 1000° C. to about 1300° C. In some embodiments, the LT seed layer had a thickness ranging from about 20 nm to about 80 nm. In some embodiments, the LT seed layer is formed at a temperature ranging from about 900° C. to about 1000° C.

Method 300 continues with operation 304 in which a graded layer is formed on the HT seed layer. In some embodiments, the graded layer includes an aluminum-gallium nitride ($Al_xGa_{1-x}N$) layer. In some embodiments, the graded aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, a HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded aluminum gallium nitride layer has a continuous gradient of the ratio x gradually decreased from the bottom to the top. In some embodiments, x ranges from about 0.5 to about 0.9. In some embodiments, the graded layer is formed at a temperature ranging from about 1000° C. to about 1200° C. In some embodiments, the graded layer is doped with p-type dopants, such as carbon, iron, magnesium, zinc or other suitable p-type dopants.

Figure 4:
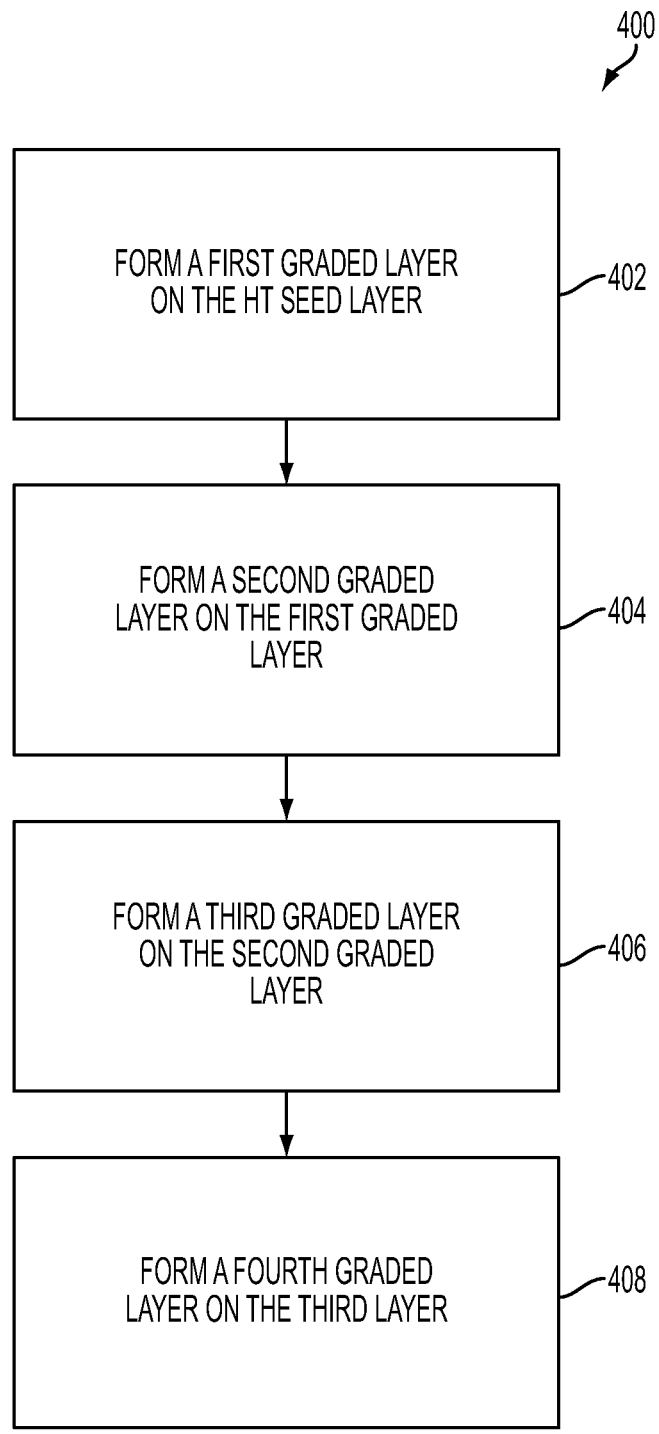
FIG. 4 is a flow chart of a method of making a graded layer in accordance with one or more embodiments.

FIG. 4 is a flow chart of a method 400 of making a graded layer in accordance with one or more embodiments. Method 400 begins operation 402 in which a first graded layer is formed on the HT seed layer. The first graded layer adjoins nucleation layer 104. The first graded layer includes $Al_xGa_{1-x}N$, where x ranges from about 0.7 to about 0.9. A thickness of the first graded layer ranges from about 50 nm to about 200 nm. A p-type dopant concentration of the first graded layer is greater than or equal to $1 \times 10^{17}$ ions/cm$^3$. In some embodiments, the first graded layer is formed using epitaxy. In some embodiments, the first graded layer is formed at a temperature ranging from about 1000° C. to about 1200° C.

Method 400 continues with operation 404 in which a second graded layer is formed on the first graded layer. The second graded layer includes $Al_xGa_{1-x}N$, where x ranges from about 0.4 to about 0.6. A thickness of the second graded layer ranges from about 150 nm to about 250 nm. A p-type dopant concentration of the second graded layer is greater than or equal to $3\times10^{17}$ ions/cm$^3$. In some embodiments, the second graded layer is formed using epitaxy. In some embodiments, the second graded layer is formed at a temperature ranging from about 1000° C. to about 1200° C.

In operation 406, a third graded layer is formed on the second graded layer. The third graded layer includes Al$_x$Ga$_{1-x}$N, where x ranges from about 0.15 to about 0.3. A thickness of the third graded layer ranges from about 350 nm to about 600 nm. A p-type dopant concentration of the third graded layer is greater than or equal to $5\times10^{17}$ ions/cm$^3$. In some embodiments, the third graded layer is formed using epitaxy. In some embodiments, the third graded layer is formed at a temperature ranging from about 1000° C. to about 1200° C.

In operation 408, a fourth graded layer is formed on the third graded layer. The fourth graded layer includes Al$_x$Ga$_{1-x}$N, where x ranges from about 0.05 to about 0.1. A thickness of the second graded layer ranges from about 800 nm to about 1500 nm. A p-type dopant concentration of the fourth graded layer is greater than or equal to $1\times10^{18}$ ions/cm$^3$. In some embodiments, the fourth graded layer is formed using epitaxy. In some embodiments, the fourth graded layer is formed at a temperature ranging from about 1000° C. to about 1200° C.

Figure 5A:
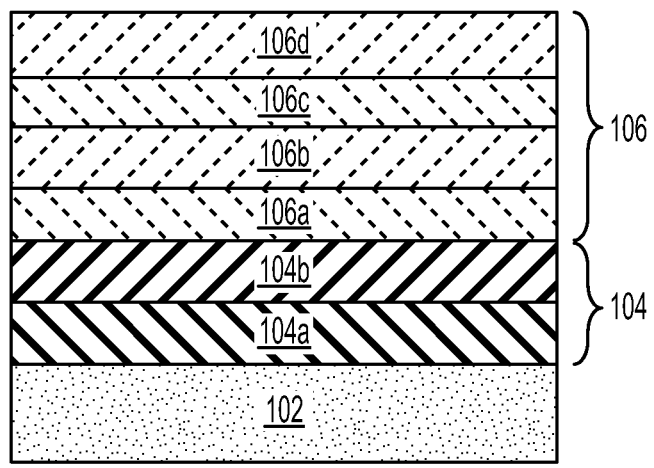
FIGS. 5A-5E are cross-sectional view of a HEMT at various stages of production in accordance with one or more embodiments.

FIG. 5A is a cross-sectional view of a HEMT following operation 304 and method 400. The HEMT includes nucleation layer 104 on substrate 102. Nucleation layer 104 includes a LT seed layer 104a on substrate 102 and a HT seed layer 104b on the LT seed layer. Graded layer 106 is on nucleation layer 104. Graded layer 106 includes a first graded layer 106a on HT seed layer 104b. Graded layer 106 further includes a second graded layer 106b on first graded layer 106a, a third graded layer 106c on the second graded layer and a fourth graded layer 106d on the third graded layer. For the same of simplicity, nucleation layer 104 and graded layer 106 are shown as single layer in the remaining cross-sectional views.

Returning to FIG. 3, method 300 continues with operation 406 in which a superlattice layer (SLS) is formed on the graded layer. In some embodiments, the SLS is formed using alternating layers of AN and GaN. In some embodiments, the SLS is formed using alternating layer of Al$_x$Ga$_{1-x}$N and a layer of Al$_y$Ga$_{1-y}$N, where x ranges from about 0.8 to about 1.0 and y ranges from about 0.0 to about 0.2. In some embodiments, the doped buffer layer is formed by performing an epitaxial process. In some embodiments, the epitaxial process includes a MOCVD process, a MBE process, a HVPE process or another suitable epitaxial process. In some embodiments, the SLS is formed at a temperature ranging from about 950° C. to about 1150° C.

In some embodiments, a number of alternating layer pairs in the SLS ranges from about 20 to about 100. In some embodiments, the SLS is doped with p-type dopants, such as carbon, iron, magnesium, zinc or other suitable p-type dopants. In some embodiments, a dopant concentration of the SLS is equal to or greater than $1\times10^{19}$ ions/cm$^3$.

Figure 5B:
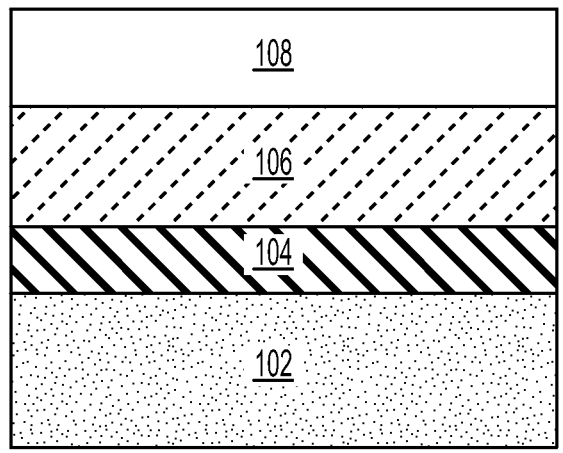

FIG. 5B is a cross-sectional view of the HEMT following operation 306. The HEMT includes SLS 108 over graded layer 106.

Returning to FIG. 3, a buffer layer is formed on the SLS in operation 308. In some embodiments, the buffer layer includes p-type dopants. In some embodiments, the buffer layer includes GaN, and the p-type doping is implemented by using dopants including carbon, iron, magnesium, zinc or other suitable p-type dopants. In some embodiments, the doped buffer layer is formed by performing an epitaxial process. In some embodiments, the epitaxial process includes a MOCVD process, a MBE process, a HVPE process or another suitable epitaxial process. In some embodiments, the doped buffer layer has a thickness ranging from about 0.5 μm to about 5.0 μm. In some embodiments, the dopant concentration in the doped buffer layer is equal to or greater than about $1\times10^{19}$ ions/cm$^3$. In some embodiments, the doped buffer layer is formed at a temperature ranging from about 1000° C. to about 1200° C.

Figure 5C:
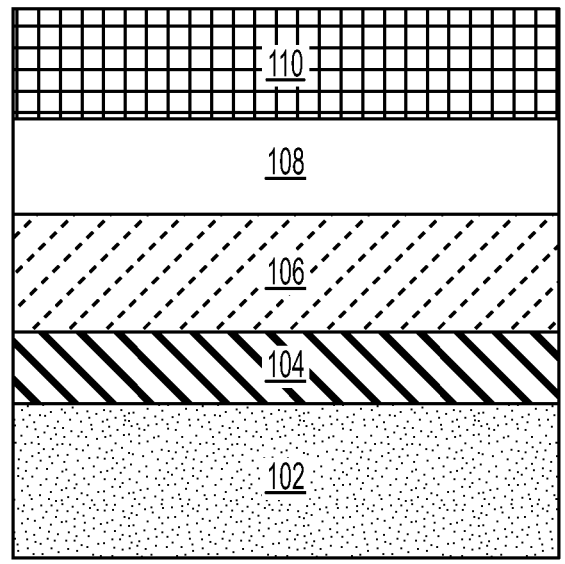

FIG. 5C is a cross-sectional view of the HEMT following operation 308 in accordance with one or more embodiments. The HEMT includes buffer layer 110 on SLS 108.

Returning to FIG. 3, in operation 310 a channel layer is formed on the buffer layer. In some embodiments, the channel layer includes p-type dopants. In some embodiments, the channel layer includes GaN, and the P-type doping is implemented by using dopants including carbon, iron, magnesium, zinc or other suitable p-type dopants. In some embodiments, the channel layer is formed by performing an epitaxial process. In some embodiments, the epitaxial process includes a MOCVD process, a MBE process, a HVPE process or another suitable epitaxial process. In some embodiments, the channel layer has a thickness ranging from about 0.2 μm to about 1.0 μm. In some embodiments, the dopant concentration in the channel layer is equal to or less than about $1\times10^{17}$ ions/cm$^3$. In some embodiments, the channel layer is undoped. In some embodiments, the channel layer is formed at a temperature ranging from about 1000° C. to about 1200° C.

Figure 5D:
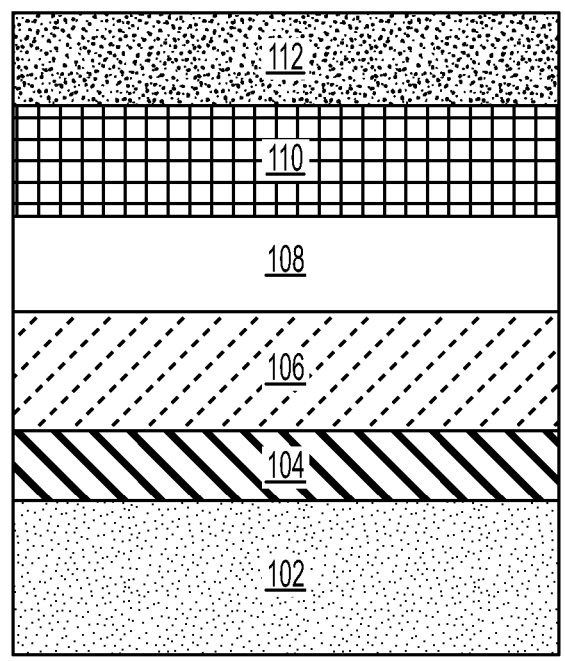

FIG. 5D is a cross-sectional view of the HEMT following operation 310 in accordance with one or more embodiments. The HEMT includes channel layer 112 on buffer layer 110.

Returning to FIG. 3, in operation 312 an active layer is formed on the channel layer. In some embodiments, the active layer includes AN, Al$_x$Ga$_{1-x}$N, combinations thereof or other suitable materials. In some embodiments, x ranges from about 0.1 to about 0.3. In some embodiments, the active layer is formed by performing an epitaxial process. In some embodiments, the epitaxial process includes a MOCVD process, a MBE process, a HVPE process or another suitable epitaxial process. In some embodiments, the active layer has a thickness ranging from about 10 nm to about 40 nm. In some embodiments where the active layer includes both AlN and Al$_x$Ga$_{1-x}$N, the AlN layer has a thickness ranging from about 0.5 nm to about 1.5 nm and the Al$_x$Ga$_{1-x}$N layer has a thickness ranging from about 10 nm to about 40 nm. In some embodiments, the active layer is formed at a temperature ranging from about 1000° C. to about 1200° C.

Figure 5E:
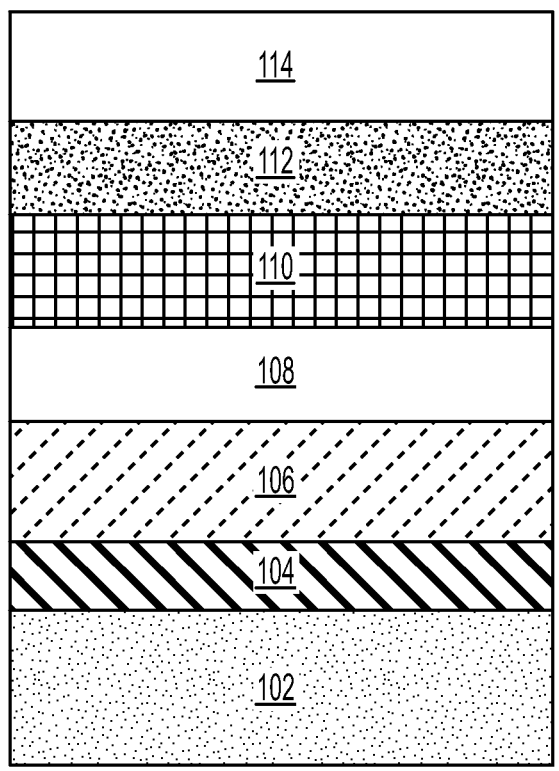

FIG. 5E is a cross-sectional view of the HEMT following operation 312 in accordance with one or more embodiments. The HEMT includes active layer 114 on channel layer 112. 2-DEG 116 is formed in channel layer 112 due to the band gap discontinuity between active layer 114 and the second portion of the channel layer.

Returning to FIG. 3, in operation 314 electrodes and a gate are formed on the active layer. The electrodes are formed over the other portion of the channel layer, and the gate is formed over the active layer. In some embodiments, a patterned mask layer (i.e., a photoresistive layer) is formed on the upper surface of the active layer, and an etching process is performed to remove a portion of the active layer to form openings partially exposing an upper surface of the other portion of the channel layer. A metal layer is then deposited over the patterned active layer and fills the openings and contacts the other portion of the channel layer. Another patterned photoresist layer is formed over the metal layer, and the metal layer is etched to form the electrodes over the openings and the gate over the upper surface of the active layer. In some embodiments, the metal layer for forming the electrodes or the gate includes one or more conductive materials. In some embodiments, the electrodes or the gate include one or more layers of conductive materials. In at least one embodiment, the electrodes or the gate include at least one barrier layer contacting the other portion of the channel layer and/or the active layer.

Following operation 314 the HEMT has a similar structure to HEMT 100.

Figure 6:
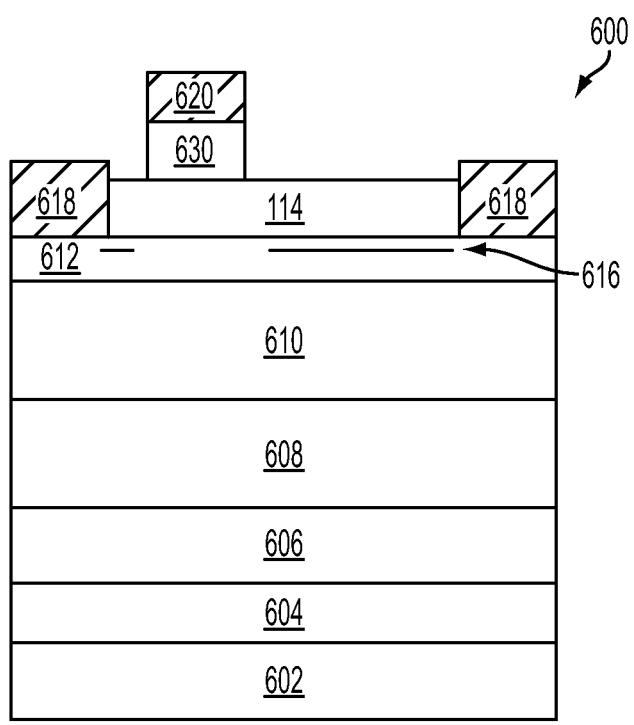
FIG. 6 is a cross-sectional view of an enhanced HEMT (E-HEMT) in accordance with one or more embodiments.

FIG. 6 is a cross-sectional view of an enhanced HEMT (E-HEMT) 600 in accordance with one or more embodiments. E-HEMT 600 is similar to HEMT 100. Similar elements have a same reference number as HEMT 100 increased by 500. In comparison with HEMT 100, E-HEMT 600 includes a semiconductor material 620 between gate 618 and active layer 612. In some embodiments, semiconductor material 620 is a group III-V semiconductor material such as GaN, AlGaN, InGaN, or another suitable group III-V semiconductor material. In some embodiments, semiconductor material 620 is doped with p-type or n-type dopants. In some embodiments, the p-type dopants include carbon, iron, magnesium, zinc or other suitable p-type dopants. In some embodiments, the n-type dopants include silicon, oxygen or other suitable n-type dopants. In comparison with HEMT 100, E-HEMT 600 is normally non-conductive between electrodes 616. As a positive voltage is applied to gate 618, E-HEMT 600 provides an increased conductivity between electrodes 616.

Figure 7:
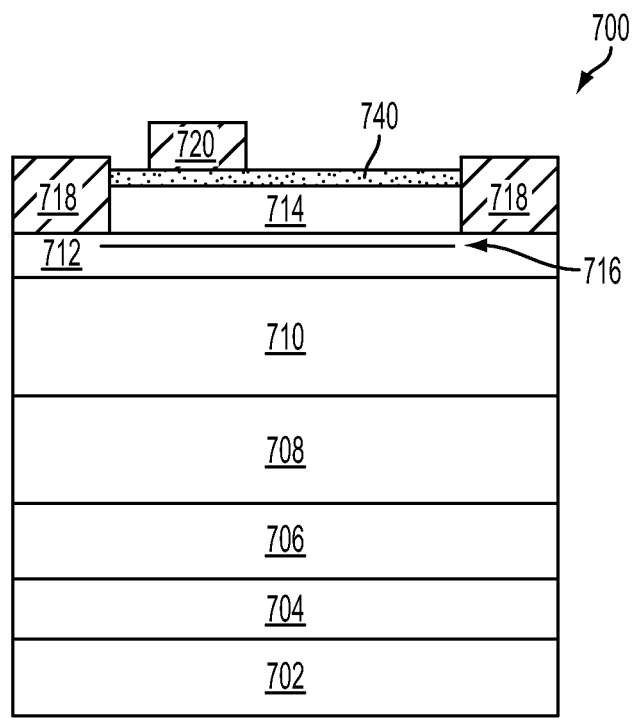
FIG. 7 is a cross-sectional view of a depletion metal-insulator-semiconductor field-effect transistor (D-MISFET) in accordance with one or more embodiments.

FIG. 7 is a cross-sectional view of a depletion metal-insulator-semiconductor field-effect transistor (D-MISFET) 700 in accordance with one or more embodiments. D-MISFET 700 is similar to HEMT 100. Similar elements have a same reference number as HEMT 100 increased by 600. In comparison with HEMT 100, D-MISFET 700 includes a dielectric layer 730 between gate 718 and active layer 712. In some embodiments, dielectric layer 730 includes silicon dioxide. In some embodiments, dielectric layer 730 includes a high-k dielectric layer having a dielectric constant greater than a dielectric constant of silicon dioxide. Similar HEMT 100, D-MISFET 700 is normally conductive between electrodes 716. As a positive voltage is applied to gate 718, D-MISFET 700 provides a decreased conductivity between electrodes 716.

Figure 8:
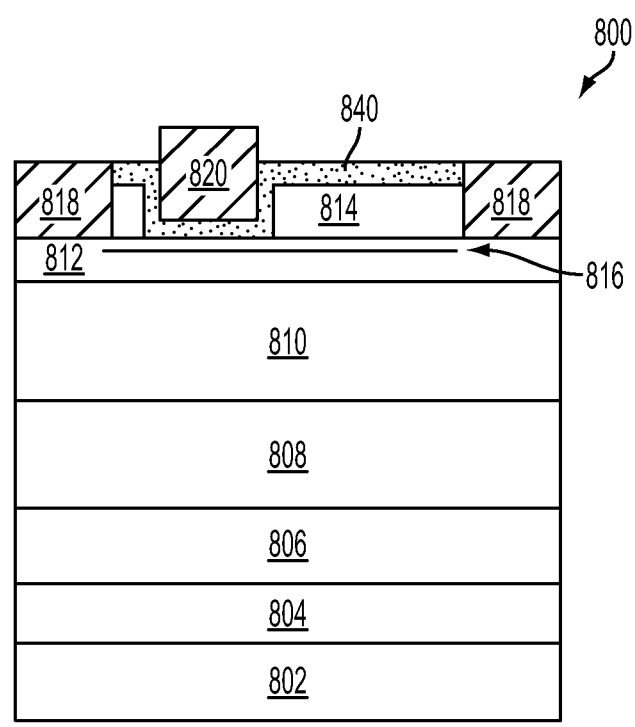
FIG. 8 is a cross-sectional view of an enhanced metal-insulator-semiconductor field-effect transistor (E-MISFET) in accordance with one or more embodiments.

FIG. 8 is a cross-sectional view of an enhanced metal-insulator-semiconductor field-effect transistor (E-MISFET) 800 in accordance with one or more embodiments. E-MISFET 800 is similar to HEMT 100. Similar elements have a same reference number as HEMT 100 increased by 700. In comparison with HEMT 100, E-MISFET 800 gate 818 is in direct contact with second portion 808b of the channel layer. E-MISFET 800 further includes a dielectric layer 840 between gate 818 and second portion 808b of the channel layer. Dielectric layer 840 also separates gate 818 and active layer 812. In some embodiments, dielectric layer 840 includes silicon dioxide. In some embodiments, dielectric layer 840 includes a high-k dielectric layer having a dielectric constant greater than a dielectric constant of silicon dioxide. In comparison with HEMT 100, E-MISFET 800 is normally non-conductive between electrodes 816. As a positive voltage is applied to gate 818, E-MISFET 800 provides an increased conductivity between electrodes 816.

One aspect of this description relates to a transistor. The transistor includes a substrate and a graded layer on the substrate, wherein the graded layer is doped with p-type dopants. The transistor further includes a superlattice layer (SLS) on the graded layer, wherein the SLS has a p-type dopant concentration equal to or greater than $1 \times 10^{19}$ ions/cm$^3$. The transistor further includes a buffer layer on the SLS, wherein the buffer layer comprises p-type dopants. The transistor further includes a channel layer on the buffer layer and an active layer on the second portion of the channel layer, wherein the active layer has a band gap discontinuity with the second portion of the channel layer.

Another aspect of this description relates to a transistor. A transistor includes a substrate and a graded layer on the substrate, wherein a p-type dopant concentration of the graded layer increases from a first surface adjacent to the substrate to a second surface opposite the first surface. The transistor further includes a superlattice layer (SLS) on the graded layer, wherein the SLS has a p-type dopant concentration equal to or greater than $1 \times 10^{19}$ ions/cm$^3$. The transistor further includes a buffer layer on the SLS, wherein the buffer layer has a p-type dopant concentration equal to or greater than $1 \times 10^{19}$ ions/cm$^3$. The transistor further includes a channel layer on the buffer layer and an active layer on the second portion of the channel layer, wherein the active layer has a band gap discontinuity with the second portion of the channel layer.

Still another aspect of this description relates to a method of making a transistor. The method includes forming a graded layer on a substrate, wherein the graded layer is doped with p-type dopants. The method further includes forming a superlattice layer (SLS) on the graded layer, wherein the SLS has a p-type dopant concentration equal to or greater than $1 \times 10^{19}$ ions/cm$^3$. The method further includes forming a buffer layer on the SLS, wherein the buffer layer comprises p-type dopants. The method further includes forming a channel layer on the buffer layer and forming an active layer on the second portion of the channel layer, wherein the active layer has a band gap discontinuity with the second portion of the channel layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A transistor comprising:
   a substrate;
   a graded layer on the substrate, wherein the graded layer is doped with p-type dopants;
   a superlattice layer (SLS) on the graded layer, wherein the SLS has a p-type dopant concentration equal to or greater than $1 \times 10^{19}$ ions/cm$^3$;
   a buffer layer on the SLS, wherein the buffer layer comprises p-type dopants;
   a channel layer on the buffer layer; and
   an active layer on an upper portion of the channel layer, wherein the active layer has a band gap discontinuity with the upper portion of the channel layer.

2. The transistor of claim 1, wherein the graded layer comprises:
   a first graded layer including $Al_xGa_{1-x}N$, where x is within the range of 0.7 to 0.9;
   a second graded layer on the first graded layer, the second graded layer including $Al_yGa_{1-y}N$, where y is within the range of 0.4 to 0.6;
   a third graded layer on the second graded layer, the third graded layer including $Al_zGa_{1-z}N$, where z is within the range of 0.15 to 0.3; and a fourth graded layer on the third graded layer, the fourth graded layer including $Al_wGa_{1-w}N$, where w is within the range of 0.05 to 0.1.

3. The transistor of claim 2, wherein a dopant concentration of the fourth graded layer is greater than a dopant concentration of the third graded layer, the dopant concentration of the third graded layer is greater than a dopant concentration of the second graded layer, and the dopant concentration of the second graded layer is greater than a dopant concentration of the first graded layer.

4. The transistor of claim 2, wherein a thickness of the first graded layer is within the range of about 50 nanometers (nm) to about 200 nm, and a dopant concentration of the first graded layer is greater than or equal to $1\times10^{17}$ ions/cm$^3$.

5. The transistor of claim 2, wherein a thickness of the second graded layer is within the range of about 150 nm to about 250 nm, and a dopant concentration of the second graded layer is greater than or equal to $3\times10^{17}$ ions/cm$^3$.

6. The transistor of claim 2, wherein a thickness of the third graded layer is within the range of about 350 nm to about 600 nm, and a dopant concentration of the third graded layer is greater than or equal to $5\times10^{17}$ ions/cm$_3$.

7. The transistor of claim 2, wherein a thickness of the fourth graded layer is within the range of about 800 nm to about 1500 nm, and a dopant concentration of the fourth graded layer is greater than or equal to $1\times10^{18}$ ions/cm$^3$.

8. The transistor of claim 1, where the SLS comprises a plurality of layer pairs, wherein each layer pair of the plurality of layer pairs comprises:
a $Al_xGa_{1-x}N$ layer, where x is within the range of about 0.8 to about 1.0; and
a $Al_yGa_{1-y}N$ layer, where y is within the range of about 0.0 to about 0.2.

9. The transistor of claim 8, wherein a thickness of the $Al_xGa_{1-x}N$ layer is within the range of about 2 nm to about 6 nm.

10. The transistor of claim 8, wherein a thickness of the $Al_yGa_{1-y}N$ layer is within the range of about 10 nm to about 30 nm.

11. The transistor of claim 1, wherein a dopant concentration of the buffer layer is equal to or greater than $1\times10^{19}$ ions/cm$^3$.

12. The transistor of claim 1, wherein the channel layer is undoped.

13. The transistor of claim 1, further comprising:
a first electrode on the channel layer;
a second electrode on the channel layer; and
a gate between the first electrode and the second electrode, wherein the gate is configured to control a conductivity of the 2-DEG between the first electrode and the second electrode.

14. The transistor of claim 13, wherein the gate is on the active layer, and the transistor is configured to be normally conductive.

15. The transistor of claim 13, further comprising a semiconductor material on the active layer between the first electrode and the second electrode, wherein the gate is on the semiconductor material and the transistor is configured to be normally non-conductive.

16. The transistor of claim 13, further comprising a dielectric layer on the active layer between the first electrode and the second electrode, wherein the gate is on the dielectric layer, and the transistor is configured to be normally conductive.

17. The transistor of claim 13, further comprising:
an opening in active layer between the first electrode and the second electrode;
a dielectric layer on the active layer and lining the opening, wherein the gate is on the dielectric layer in the opening, and the transistor is configured to be normally non-conductive.

18. A transistor comprising:
a substrate;
a graded layer on the substrate, wherein a p-type dopant concentration of the graded layer increases from a first surface adjacent to the substrate to a second surface opposite the first surface;
a superlattice layer (SLS) on the graded layer, wherein the SLS has a p-type dopant concentration equal to or greater than $1\times10^{19}$ ions/cm$^3$;
a buffer layer on the SLS, wherein the buffer layer has a p-type dopant concentration equal to or greater than $1\times10^{19}$ ions/cm$^3$;
a channel layer on the buffer layer; and
an active layer on an upper portion of the channel layer, wherein the active layer has a band gap discontinuity with the upper portion of the channel layer.

19. A method of making a transistor, the method comprising:
forming a graded layer on a substrate, wherein the graded layer is doped with p-type dopants;
forming a superlattice layer (SLS) on the graded layer, wherein the SLS has a p-type dopant concentration equal to or greater than $1\times10^{19}$ ions/cm$^3$;
forming a buffer layer on the SLS, wherein the buffer layer comprises p-type dopants;
forming a channel layer on the buffer layer; and
forming an active layer on an upper portion of the channel layer, wherein the active layer has a band gap discontinuity with the upper portion of the channel layer.

20. The method of claim 19, wherein forming the graded layer comprises:
forming a first graded layer including $Al_xGa_{1-x}N$, where x is within the range of 0.7 to 0.9, the first graded layer having a dopant concentration greater than or equal to $1\times10^{17}$ ions/cm$^3$;
a second graded layer on the first graded layer, the second graded layer including $Al_yGa_{1-y}N$, where y is within the range of 0.4 to 0.6, the second graded layer having a dopant concentration greater than or equal to $3\times10^{17}$ ions/cm$^3$;
a third graded layer on the second graded layer, the third graded layer including $Al_zGa_{1-z}N$, where z is within the range of 0.15 to 0.3, the third graded layer having a dopant concentration greater than or equal to $5\times10^{17}$ ions/cm$^3$; and
a fourth graded layer on the third graded layer, the fourth graded layer including $Al_wGa_{1-w}N$, where w is within the range of 0.05 to 0.1, the fourth graded layer having a dopant concentration greater than or equal to $1\times10^{18}$ ions/cm$^3$.

* * * * *